Figure 1:
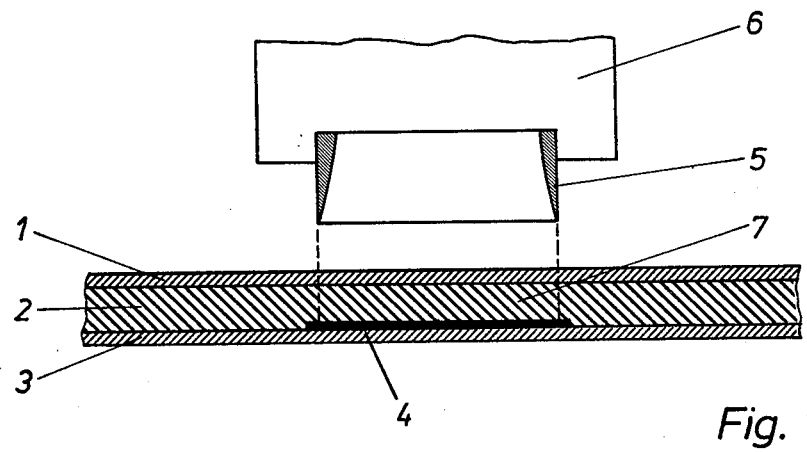

United States Patent [19]

Hoppe et al.

[11] Patent Number: 4,457,798
[45] Date of Patent: Jul. 3, 1984

[54] METHOD OF INCORPORATING IC MODULES INTO IDENTIFICATION CARDS

[75] Inventors: Joachim Hoppe; Yahya Haghiri-Tehrani, both of Munich, Fed. Rep. of Germany

[73] Assignee: GAO Gesellschaft fur Automation and Organisation mbH, Munich, Fed. Rep. of Germany

[21] Appl. No.: 379,955

[22] Filed: May 19, 1982

[30] Foreign Application Priority Data

Jun. 10, 1981 [DE] Fed. Rep. of Germany ....... 3122981

[51] Int. Cl.³ .............................................. B32B 31/18
[52] U.S. Cl. .................................... 156/248; 156/268; 156/289; 156/293; 156/344
[58] Field of Search ............... 156/248, 257, 268, 289, 156/293, 344; 40/625, 626, 628, 629, 630

[56] References Cited

U.S. PATENT DOCUMENTS 3,508,754  4/1970  Shorin .................................. 156/289

FOREIGN PATENT DOCUMENTS 2920012  11/1980  Fed. Rep. of Germany .
3029939   3/1982  Fed. Rep. of Germany .

Primary Examiner—Caleb Weston
Attorney, Agent, or Firm—Sandler & Greenblum

[57] ABSTRACT

A method of producing an identification card having an IC module arranged on a carrier element.

The carrier element is inserted into a recess in the card. The card has a multilayer construction and bears a separation layer between at least two card layers in the area intended to take up the carrier element. The card is produced by the usual reliable methods. The recess for the carrier element in the form of a punched or blind hole is created by punching through the edge of the portion of the card to be removed up to the separation layer, and removing the severed plug-like element along with the separation layer from the recess. The carrier element is finally stuck into the recess. The production of the recess in the finished card by means of a punching or cutting device can be carried out completely free of dust and chips.

The production of the identification card and the embedding of the IC module or carrier element are carried out independently of one another, so that the sensitive IC module is not subjected to the operational sequences of the production of the card.

10 Claims, 7 Drawing Figures

METHOD OF INCORPORATING IC MODULES INTO IDENTIFICATION CARDS

The invention relates to a method of producing an identification card having an embedded IC module arranged on a carrier element, whereby the carrier element is inserted into a recess in the card and the identification card comprises at least one inlay with cover films laminated on.

Identification cards having IC modules have been known for some time, and there are different methods of producing them, some of which are fairly elaborate.

For example, No. P 30 29 939.9 sets forth, among other things, a method of producing identification cards having IC modules, in which the IC module and its contacts are attached to a carrier element and encapsulated for protection against mechanical stress. This carrier element and IC module and contacts, together producible as a separate unit, is set into a punched out recess in the card inlay and then hot-laminated. In order to compensate pressure and temperature points that might occur in the process and could otherwise endanger the sensitive IC module, special precautionary measures, such as buffer zones built into the card laminate, must be provided in the laminating process.

Another method of embedding IC modules in identification cards consists in punching the entire area for the IC module out of the laminated identification card. The component is then inserted into the recess and provided on both sides with cover films by means of a cold-laminating process so as to fix the IC module in the card. However, the advantages of a hot-laminated card, especially as far as the optical and surface quality are concerned, can only be attained by this laminating technique with great difficulty.

As an alternative to the cold-laminating method it has been proposed that blind holes, in which the IC modules can be attached, be cut into hot-laminated identification cards. The particular disadvantage of this method has turned out to be the great amount of dust and shavings involved, making it difficult to produce high quality identification cards in connection with the general static charge of the synthetic films. Elaborate cleaning measures are necessary to eliminate this disadvantage, thus impeding the production sequence unjustifiably.

The problem of the invention is to propose a method of producing identification cards which avoids the above-mentioned disadvantages of hot-lamination while retaining its advantages.

The problem is solved according to the invention by the features stated in the main claim. A separation layer is provided in a multilayer card laminate between at least two card layers in the area intended to take up the carrier element and the IC module, and the recess for the carrier element is created by punching through the edge of the portion of the card to be removed until the separation layer is reached, removing the severed plug-like element along with the separation layer from the recess, and inserting the carrier element into the recess.

It is an advantage of the method according to the invention that the identification card can be produced separately from the embedding of the IC module without any special additional measures. Embedding can take place independently of card production without any problems, e.g. in a branch factory or by the client or user himself.

A further advantage of the new method is that the IC module can also be placed in the area of the magnetic stripe provided on the back of standard identification cards, which is not possible, for example, in the case of the punching through method.

Furthermore, the production of the card can be organized more rationally, as no particular precautionary measures must be taken to protect the IC module, for example, during the laminating process. The usual reliable card technology can be used to prefabricate the identification cards into which only the carrier element and the IC module must then be inserted. In this way any hot-laminated cards can also be processed, so that their advantages are retained. The fact that the sensitive IC module is no longer subjected to the operational sequences of the production of the card also decreases the reject rate of IC modules which can otherwise not be avoided. The plug-like element can be severed free of dust and shavings by either a punching or a cutting device. So that punching tolerances are taken into consideration, the embedded separation layer can also be larger than the punched hole. The separation layer, e.g. silicone mixed with a solvent, is pressed onto the lower side of the card inlay, for example, in the area of the recess to be created, so that the silicone sticks to the card inlay when the solvent has escaped but does not enter into combination with the cover film during subsequent lamination. It is thus ensured that the separation layer is removed from the recess along with the plug-like element.

Further embodiments and advantages of the invention can be found in the description of the figures listed below.

Figure 2:
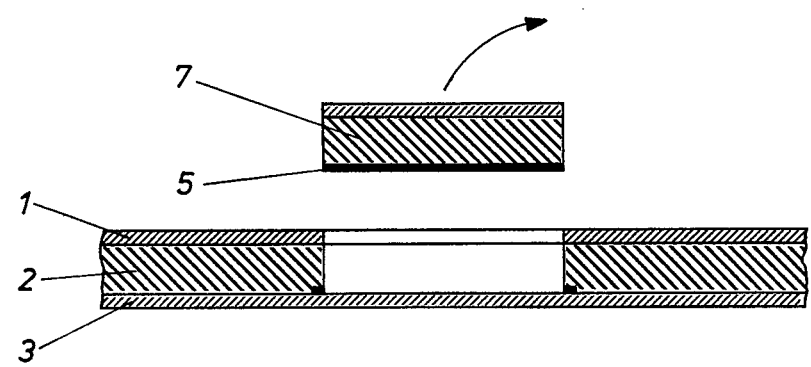
Figure 3:
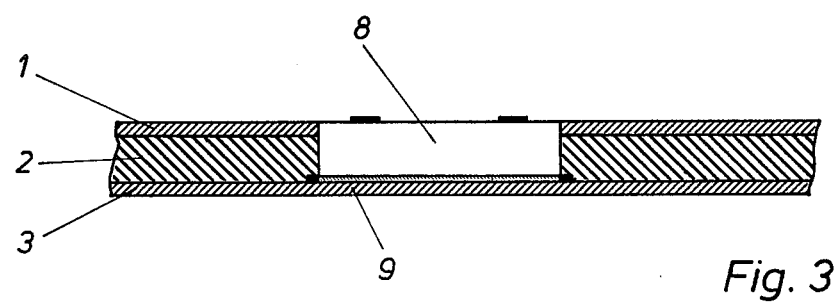
Figure 4:
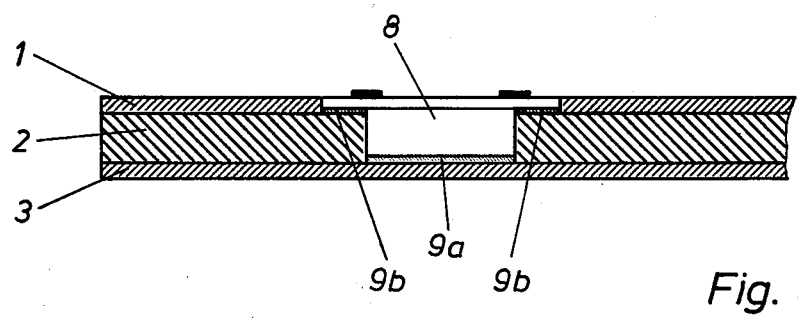
Figure 5:
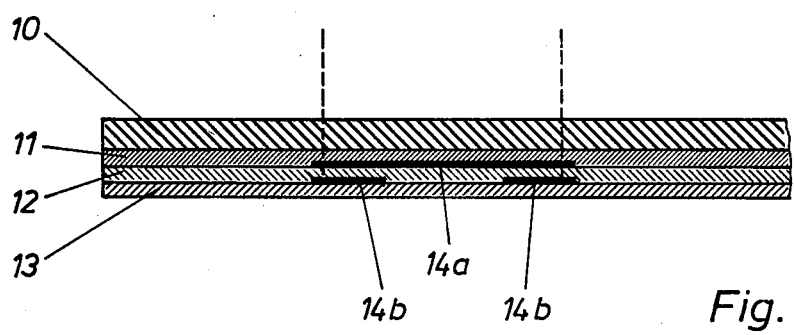
Figure 6:
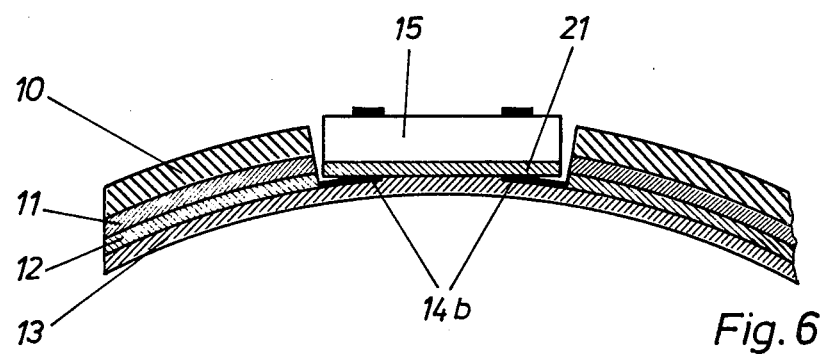
Figure 7:
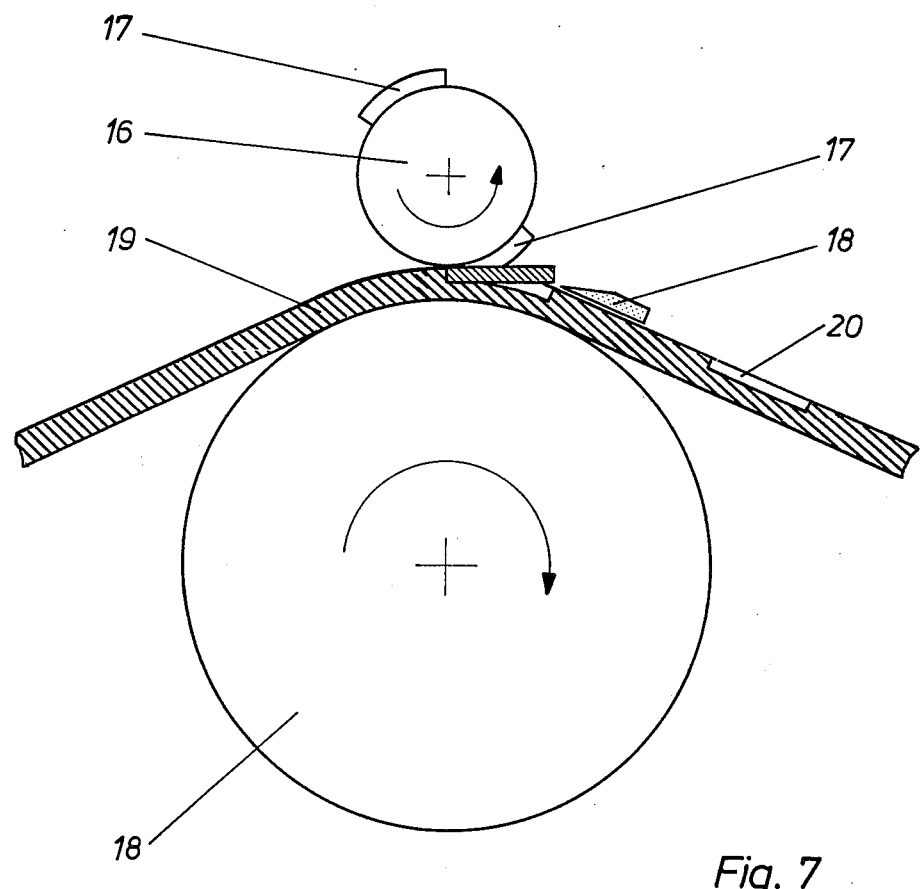

FIG. 1 an identification card with an embedded separation layer and a punching device;

FIG. 2 an identification card with a punched out or cut out recess and a plug-like element;

FIG. 3 an identification card with an embedded IC module;

FIGS. 4,5,6 further embodiments of an identification card with an embedded IC module;

FIG. 7 a punching device.

FIG. 1 shows a hot-laminated identification card in which only the recess for the IC module is yet to be made and the latter inserted. On the middle card layer 2 (card inlay) there is separation layer 4 which is not connected with cover film 3 of the card. An appropriate material for the separation layer is, for example, silicone mixed with a solvent, pressed onto card inlay 2 in the area of the recess to be created before lamination of films 1,3. After the solvent has escaped the silicone layer 4 sticks to card inlay 2, but does not enter into combination with cover film 3 during lamination. The separation layer can also be made of a thermostable material which does not enter into combination with the cover film at the laminating temperatures involved, e.g. a polyester film coated on one side with PVDC (polyvinylidene chloride), whereby the PVDC layer ensures adhesion to the middle card layer 2.

So that punching tolerances can be taken into consideration the silicone layer 4 is somewhat larger than the surface area of the recess to be created. Plug-like element 7 can be severed, for example, with schematically shown punching tool 6, the cutting edge 5 of which is exactly fitted to the periphery and depth of the recess. The height of cutting edge 5 is adjusted in holder 6 in such a way that the latter forms the stop on the surface of the card during punching.

FIG. 2 shows an identification card with a punched out recess and plug-like element 7, stuck to on the bottom by the separation layer 5 which has been removed along with plug-like element 7.

FIG. 3 shows a finished identification card with an embedded IC module 8 which has been attached to the card by means of adhesive 9.

Another embodiment is shown in FIG. 4, in which a two-step punching or cutting device is used and carrier element 8 and the IC module are fixed on two planes of the card. Separation layers are applied, for example, as depicted above, to middle card layer 2 on its lower side in area 9a and on its upper side in areas 9b, in order to create this shape of recess. During the punching process the outer edge of the recess to be created is only severed up to layer 2, whereas the lower portion is punched through to lower cover layer 3. After the plug-like element has been removed, carrier element 8 can be attached by means of an adhesive applied in areas 9a, 9b. This type of attachment assures an especially stable anchoring of carrier element 8 in the identification card.

FIGS. 5 and 6 show a further embodiment of an identification card characterized by base 21 intended for the holder of carrier element 15. This base 21 protects carrier element 15 against at least unidirectional bending strain. To produce this shape of recess and the base, separation layers 14a,b are embedded in the card layers, whereby layers 10, 12,13 are made of the same material to attain a symmetrical construction of the card, which is desirable for reasons of stability. Separation layer 14b, unlike layer 14a, does not cover the entire punching area, but rather only a part of it. In the case at hand it has an annular shape.

The upper card layers are severed through to lower separation layer 14b, and the plug-like element thus formed, which only extends to separation layer 14a, is removed along with the latter. Separation layer 14b remains in the card and ensures that base 21 does not stick to lower laminating film 13 in the peripheral area of the carrier element. Carrier element 15 is stuck to the base over its entire surface and is thus connected with the material of the card over its entire surface, which is advantageous relative to adhesion at various points, which would have a similar effect.

FIG. 7 shows reel punching device 16,17 for the rational production of recesses 20 to take up IC modules, whereby the sketches are not true to scale for the sake of better illustration. A multi-use sheet 19 is directed in continuous operation between pressure cylinder 18 and punching cylinder 16. The diameter of punching cylinder 16 and the number, shape and height of cutting edges 17 are fitted to the distance, shape and depth of recesses 20. Cut out plug-like elements are removed from recesses 20 by a stripper 18. The reel punching method has the advantage that no punching marks arise on the back of the card and a very high throughput can be attained.

It is obvious to the expert that the invention is not only significant in the domain of hot-lamination as described, but that essential advantages can also be gained when the card is produced by the cold-lamination method.

We claim:

1. A method of producing an identification card which includes a carrier element and an embedded IC module thereon, wherein said card has a recess and said carrier element is positioned within said recess, said identification card further comprising at least one card inlay having at least one cover film laminated thereon, said method comprising:
    (a) positioning at least one separation layer between one cover film and said card inlay layer, said separation layer comprising means for preventing said one cover film and said card inlay from sticking together during lamination of said card inlay and said at least one film into an assembly;
    (b) laminating said at least one film to said card inlay layer by applying heat and pressure to said assembly;
    (c) forming a recess in said assembly to provide room for inserting said carrier element into said assembly by cutting a hole in said assembly to the depth of said separation layer;
    (d) removing the cut portion from said assembly together with at least a portion of said separation layer; and
    (e) inserting said carrier element into said recess and adhering said carrier element to a surface of said recess.

2. A method in accordance with claim 1 wherein said hole is cut by punching out a portion of said assembly.

3. A method in accordance with claim 1 wherein only a portion of said separation layer is removed with the cut portion of said layer assembly, the remaining portion of said separation layer remaining attached to a portion of said assembly which surrounds said recess.

4. A method in accordance with claim 3 wherein said separation layer comprises silicone.

5. A method in accordance with claim 4 wherein said separation layer is applied to said card inlay by printing, said printing comprising silicone mixed with a solvent.

6. A method in accordance with claim 4 wherein said separation layer comprises a polyester film coated with PVDC and attached to said card inlay by an adhesive.

7. A method in accordance with claim 1 wherein said separation layer is positioned between a cover film and said card inlay.

8. A method in accordance with claim 7, said method further comprising placing an additional separation layer over a portion of said film which is exposed when said recess is formed.

9. A method in accordance with claim 1 wherein at least two separation layers are positioned within said assembly, at least one separation layer being positioned on each side of said card inlay, said recess being formed in two cutting steps, said cutting steps forming recesses of different diameters.

10. A method in accordance with claim 9, wherein one of said recesses is cut through one film layer and one of said separation layers, and wherein a second one of said recesses is a deeper recess which is coaxial with said first recess, said second recess being cut through said first film layer, two of said two separation layers, and said inlay card, said second recess having a smaller diameter than said first recess.

* * * * *